United States Patent
De Jager et al.

(10) Patent No.: US 6,835,943 B2
(45) Date of Patent: Dec. 28, 2004

(54) ELECTRON-BEAM LITHOGRAPHY

(75) Inventors: Pieter Willem Herman De Jager, Rotterdam (NL); Gerardus Johannes Verhaart, Eindhoven (NL); Quirinus Antonius Gerardus Van Vlimmeren, Veldhoven (NL)

(73) Assignee: Singulus Mastering B.V., Eindhoven (NL)

( * ) Notice: Subject to any disclaimer, the term of this patent is extended or adjusted under 35 U.S.C. 154(b) by 0 days.

(21) Appl. No.: 10/275,649
(22) PCT Filed: May 1, 2001
(86) PCT No.: PCT/NL01/00328
§ 371 (c)(1), (2), (4) Date: Mar. 18, 2003
(87) PCT Pub. No.: WO01/86649
PCT Pub. Date: Nov. 15, 2001

(65) Prior Publication Data
US 2003/0155532 A1 Aug. 21, 2003

(30) Foreign Application Priority Data
May 11, 2000 (NL) .............................. 1015155

(51) Int. Cl.[7] .............................. H01L 21/00; G11B 7/26
(52) U.S. Cl. ................. 250/492.3; 250/492.1; 250/492.2
(58) Field of Search .................. 250/492.3, 492.1, 250/400, 492.2

(56) References Cited

U.S. PATENT DOCUMENTS

| | | | |
|---|---|---|---|
| 4,104,489 A | * 8/1978 | Satoh et al. | 369/103 |
| 4,199,688 A | 4/1980 | Ozasa | |
| 5,216,219 A | * 6/1993 | Yokozeki et al. | 219/121.19 |
| 5,561,008 A | 10/1996 | Berger et al. | |
| 5,605,782 A | * 2/1997 | Put et al. | 430/321 |
| 5,942,760 A | 8/1999 | Thompson et al. | |
| 6,051,346 A | * 4/2000 | Kornblit et al. | 430/5 |

FOREIGN PATENT DOCUMENTS

| | | | | |
|---|---|---|---|---|
| JP | 11-288531 | * 10/1999 | | G11B/7/26 |
| JP | 11288532 | 10/1999 | | |

* cited by examiner

Primary Examiner—Nikita Wells
Assistant Examiner—Anthony Quash
(74) Attorney, Agent, or Firm—Pillsbury Winthrop LLP

(57) ABSTRACT

A device for electron-beam lithography wherein very small pits can be written, using a small beam intensity, by exposing each pit several times during writing. A row of electron beams is arranged in the longitudinal direction of the track. Each beam from the row of beams can be controlled, either to be projected onto the track via electron optics, or to be scattered to an electron absorbing position. The control of the row of beams ensures that each time a track position to be exposed passes the projection position of a beam from said row of beams, the beam in question is projected onto the position in question. Furthermore means are provided for shifting the beams from the row of beams in transverse direction on the track for the purpose of writing a second track simultaneously with the main track. Finally, several rows of beams arranged one beside another for simultaneously writing onto two tracks arranged one beside another are described.

22 Claims, 10 Drawing Sheets

ELECTRON-BEAM LITHOGRAPHY

This application is the National Phase of International Application PCT/NL01/00328, filed May 1, 2001, which designated the U.S. and that International Application was published under PCT Article 21(2) in English.

BACKGROUND OF THE INVENTION

(1) Field of the Invention

The invention relates to a device for electron-beam lithography for manufacturing a master disk, comprising means for moving the master disk, means for generating a row of electron beams and means for directing electrons from said row of beams onto a track on the master disk.

(2) Description of Related Art

The invention also relates to a method for the electron-beam lithography manufacture of a master disk, wherein a row of electron beams is generated and directed onto a track on the master disk.

Such a device and method are known from U.S. Pat. No. 5,216,219.

According to said US patent, information is written onto a so-called master disk by means of one or more controllable electron beams.

Electron-beam lithography has developed after the limit was reached in optical lithography as regards the smallest spot that could reasonably be formed by optical means. This complicates the step of moving on to next generations of high-density formats that can be recorded on an optical plate. Electron-beam lithography makes it possible to record significantly smaller pits/grooves on an optical plate. Recording on an optical plate takes place both by making a copy of a so-called master disk formed of a hard material and by writing user information onto optical disks.

Electrons are electrically charged particles which are all identically charged, so that electric repulsion occurs among them. The more electrons are contained within a particular volume, the stronger the mutual repulsion. The consequence of this is that the smaller the spot that is intended to be made of an electron beam, the smaller the beam intensity should be in order to prevent the electron density becoming so large that noticeable repulsion starts to take place among the electrons. One consequence of this is that the recording time for making a master disk will be very long. It has been attempted to find a solution by using a more sensitive resist, to be sure, but this offers only a limited solution, since the signal will exhibit noise when the number of electrons is too low.

SUMMARY OF THE INVENTION

The object of the invention is to provide a system by which various combinations of pits and grooves can be written within a short time and in a flexible manner, and wherein the above-described drawbacks are largely or completely eliminated.

In order to accomplish that objective, a device for electron-beam lithography apparatus according to the invention is characterized in that the row of beams extends substantially parallel to the track, in that an aperture element comprising at least one aperture is provided, in that first lens means are disposed between the means for generating said row of beams and the aperture element for the purpose of deflecting electrons in said row of beams in the direction of said at least one aperture, and in that second lens means are disposed between the aperture element and the master disk for the purpose of deflecting electrons that have passed through said at least-one aperture in an intended direction onto the master disk, and in that controllable means for deflecting electrons in said row of beams to a position substantially beside the aperture are disposed between the means for generating said row of beams and said aperture element.

A method according to the invention is characterized in that said row of electron beams is applied in a direction substantially parallel to the track on the master disk, in that said row of beams is deflected through an aperture in an aperture element by a first lens element and projected onto the master disk by a second lens element, and in that said beams are controlled either to be directed at the aperture or not to be directed at the aperture.

As a result of the above aspects, one and the same spot on the master disk can be "exposed" to an electron beam from the row of beams a number of times, wherein successive electron beams from said row of beams are used for successive exposures. The controllable means make it possible either to direct a beam from said row of beams through the aperture, similarly to the process of "exposing" the resist on the master disk, or not to direct said beam through the aperture, similarly to the process of "not exposing" the resist on the master disk. In this manner it is ensured that a very short "exposure time" is used for each exposure of the resist to a beam of electrons, whilst a sufficiently long overall "exposure time", in particular sufficiently long for minimizing the amount of noise in the signal, can be achieved by selecting a sufficiently large number of beams in the row of beams.

From U.S. Pat. No. 5,561,008 there is known an electronic lithography apparatus wherein an electron beam is transmitted through a mask, and wherein the scattered and unscattered electrons of the beams that are transmitted through the mask are projected onto an aperture element comprising at least one aperture via a first lens, and wherein subsequently said electrons are projected onto the disk material coated with a layer of an electron-sensitive material by a second lens disposed between the aperture element and the master disk. In this case the repeated projection of a complete two-dimensional pattern via electron optics and an aperture onto an electron-sensitive resist on a disk of semiconductor material is concerned. The technology disclosed in said patent is not directed at the writing of pits/grooves in a rotating master disk, nor does it refer thereto.

One preferred embodiment of a device for electron-beam lithography according to the invention is characterized in that control means are present for operating the controllable means in succession, each time from a first beam from said row of beams until a last beam from said row of beams, by means of a signal train, which is based on one and the same, respectively time-shifted signal train for each beam from said row of beams.

One preferred embodiment of a method according to the invention is characterized in that, seen in the direction of movement of the track relative to the row of beams, all controlled beams are controlled in succession, from a first beam from the row of beams to a last beam from said row of beams, by a signal train, which is based on one and the same, respectively time-shifted, signal train for each beam from said row of beams.

In this manner it is achieved that the quality of the signal that is eventually written onto the master disk, using a very low intensity per electron beam, is similar to that of the signal that is written by means of a beam having a much higher intensity. The dimensions of the pits/grooves, however, match the low intensity of the individual electron beams from the row of beams that are projected onto the master disk via the aperture by the first and the second lens means.

One preferred embodiment of the invention is characterized in that controllable deflection means are provided for deflecting one or more beams from the row of beams in a direction substantially perpendicularly to a direction of movement of the track.

As a result of this arrangement, also so-called "two-spot" applications are possible. With such applications, two tracks are written closely together at the same time. Another result is that it is possible to write a so-called "wobble" track, or even two "wobble" tracks beside each other.

Yet another embodiment of a device for electron-beam lithography according to the invention is characterized in that said controllable means cause magnetic deflection.

A suitably selected magnetic deflection, for example by means of one or more coils that generate a magnetic field comprising a component which is not axial with the respective beam from the row of beams, makes it possible to ensure that the respective electron beam is strongly scattered in many directions. The advantage of this is that the beam is not projected in concentrated form at one specific spot on the aperture element, but that it is distributed over said element. This is advantageous in connection with the thermal load on the aperture element.

BRIEF DESCRIPTION OF THE DRAWINGS

The invention will now be explained in more detail with reference to the appended drawings, wherein.

DETAILED DESCRIPTION OF EMBODIMENTS OF THE INVENTION

Figure 1:
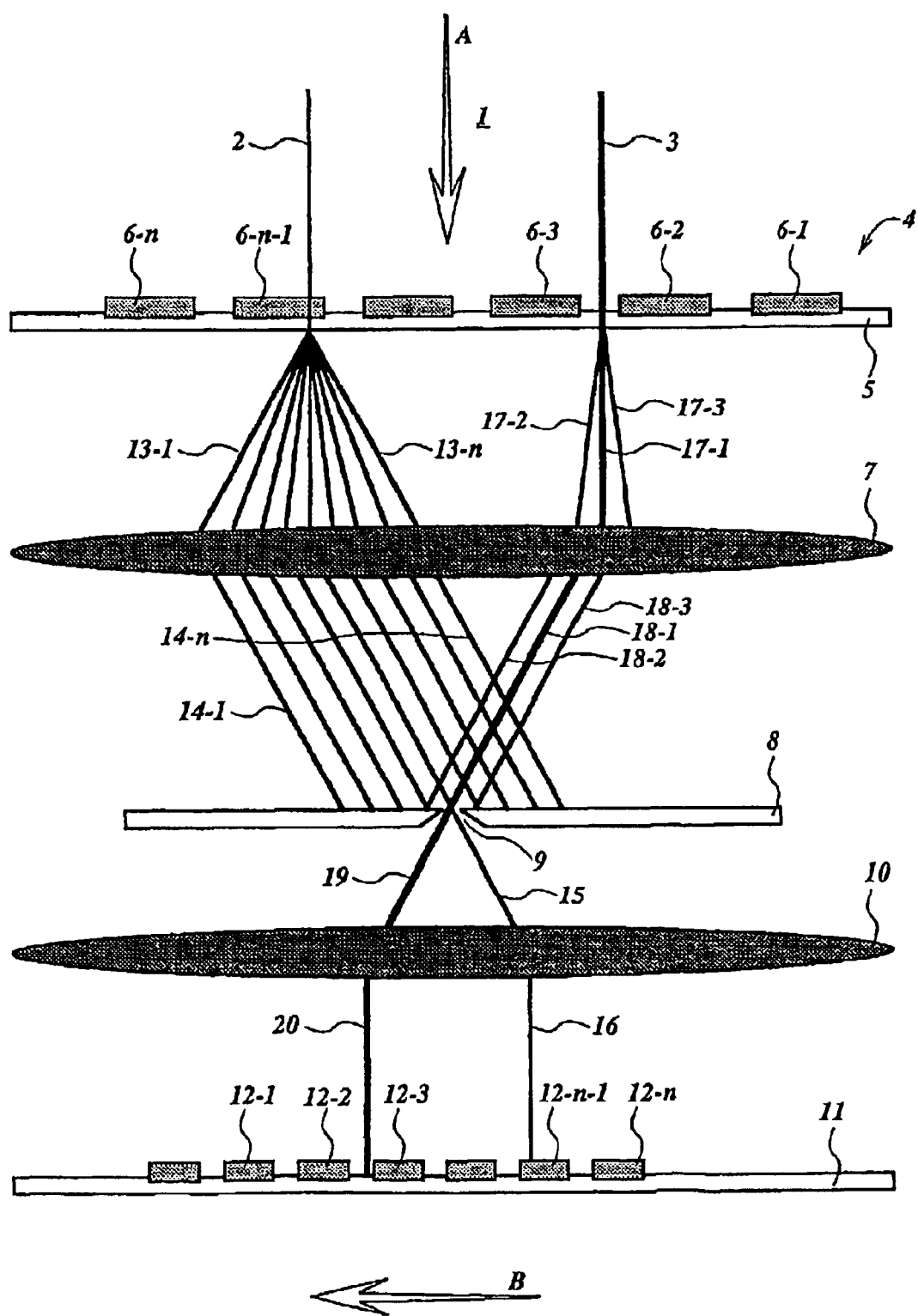
FIG. 1 shows the manner in which a row of electron beams can be formed by means of a grid pattern.

In FIG. 1, reference numeral 1 indicates an electron beam being emitted in the direction indicated by arrow A by an electron supplying device which is known per se, such as an incandescent filament.

In particular, two parts 2 and 3 of the electron beam are shown. Electron beam 1 hits upon an element 4 consisting of an electron-transparent carrier 5, on which electron absorbing and/or electron scattering elements 6-1, 6-2, . . . 6-n are present. Disposed further ahead in the direction indicated by arrow A is an electron lens 7. Disposed further ahead yet in the direction indicated by arrow A is an aperture element 8 comprising an aperture 9. Disposed even further ahead in the direction indicated by arrow A is an electron lens 10. Reference numeral 11 finally indicates a master disk. Master disk 11 rotates about an axis (not shown), which extends parallel to the plane of drawing and which is located outside said plane. A master disk 11 moves from the right to the left in the plane of drawing, as is indicated by arrow B.

In FIG. 1 the electron optical projection of the scattering positions 6-1, . . . , 6-n is indicated by numerals 12-1, 12-2, 12-3, . . . , 12-n–1, 12-n by way of illustration.

Electron beam 2, which forms part of the electron beam 1, hits upon the scattering position 6-n–1. As a consequence of that, part of the electrons from the electron beam 2 are absorbed, and the other electrons are scattered at substantial angles with respect to the direction indicated by arrow A, as is indicated by scattered rays 13-1 until 13-n. The position and the strength of electron lens 7 are such that electron beams 13-1, . . . , 13-n exit more or less parallel to each other as electron beams 14-1 until 14-n from electron lens 7. Only a very small number of electrons originating from electron beam 2 pass the aperture element 8 through aperture 9 as electron beam 15. Electron beam 15 is finally deflected by electron lens 10 to form electron beam 16, which hits upon the electron-sensitive resist on the master disk 11 at the location of 12-n–1 with an extreme small intensity. Said intensity is so low that this does not lead to a noticeable effect in the electron-sensitive resist on master disk 11.

Electron beam 3 passes through carrier 5 substantially without resistance and continues with substantially the same intensity as electron beam 17-1. Scattering occurs only to a small extent in carrier 5, both as regards numbers and as regards scattering angles, as is indicated by beams 17-2 and 17-3. The electron lens 7 deflects beams 17-1, 17-2 and 17-3 in the direction of aperture 9 in aperture element 8 to form beams 18-1, 18-2 and 18-3. The intensity of electron beams 18-2 and 18-3 is extremely small. Nevertheless, also these beams are caught by aperture element 8, and only beam 18-1 can pass through aperture 9 of aperture element 8 as beam 19. Beam 19 is deflected in the direction of master disk 11 by electron lens 10 to form beam 20. Beam 20 hits upon master disk 11 between the "images" 12-2 and 12-3 of scattering positions 6-2 and 6-3, respectively. The intensity of electron beam 20 is in principle the same as that of electron beam 17-1, whose intensity is only minimally smaller than that of electron beam 3. The intensity of electron beam 20 is such that a noticeable effect occurs in the electron-sensitive resist on master disk 11.

The dimensions of the device that is shown in FIG. 1 are only very small, seen in a direction perpendicularly to the plane of drawing. Said dimensions are in the order of the width of a track on the master disk 11, which ranges from 50–500 nm. The dimensions of the images 12-1, 12-2, . . . and of the spaces therebetween are in the order of 50 nm. Preferably, but not necessarily so, the electron lenses 7 and 10 form a reduced image of the linear grid pattern 6-1, 6-2, . . . , 6-n on the carrier 5 on master disk 11. Preferably, mask 5 is formed of a material consisting of elements having a lower atomic number, and the scattering positions 6-1, 6-2 etc. are formed of a material having a higher atomic number, in which latter material the incident electrons from beam 1 will be scattered to a significant degree.

Figure 2:
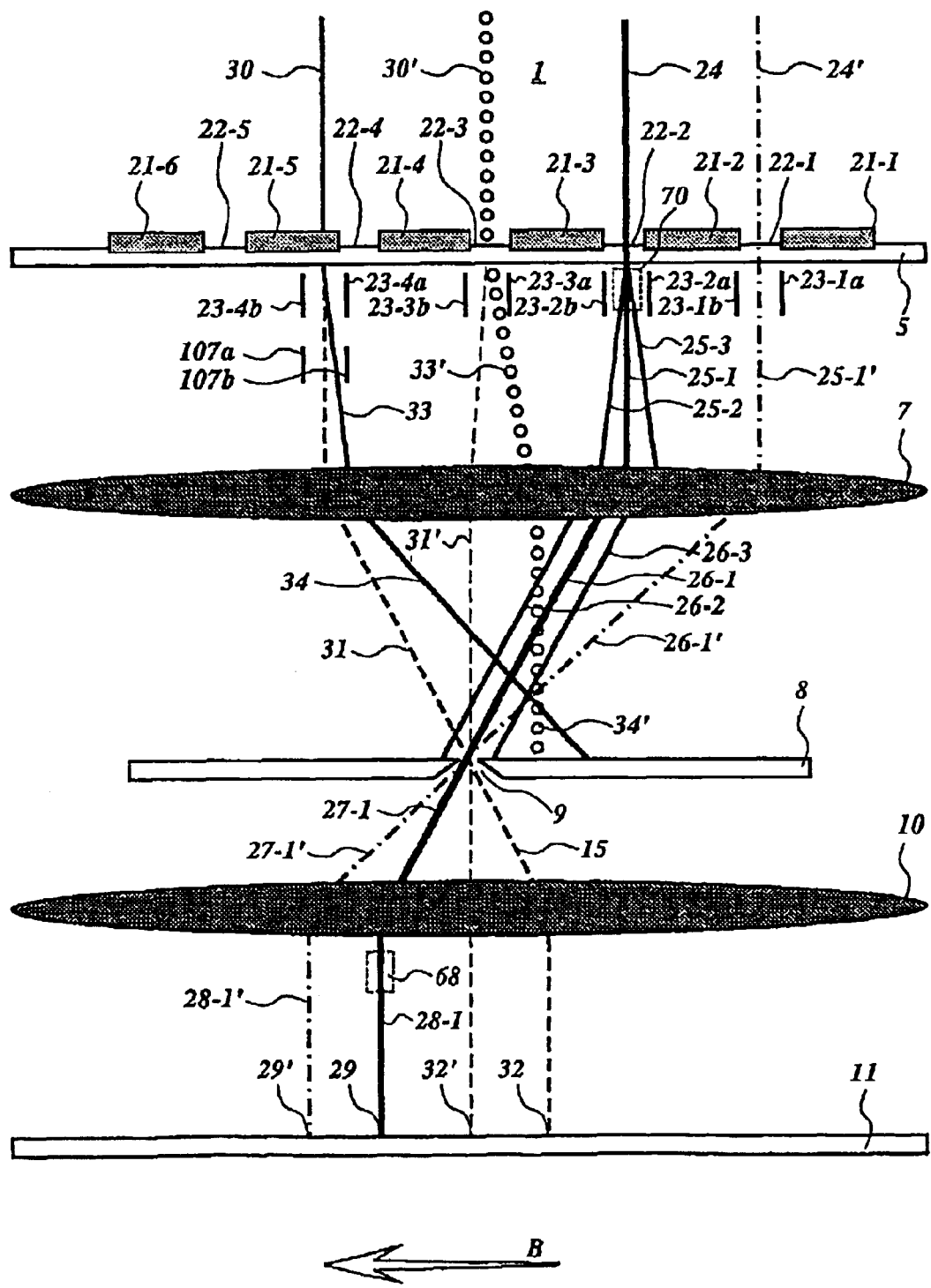
FIG. 2 shows a first embodiment of a device according to the invention.

In FIG. 2, numerals 21-1, 21-2, . . . , 21-6 indicate six successive scattering positions on carrier 5. Located between said scattering positions are transmission positions 22-1, 22-2, 22-3, 22-4 and 22-5. Electrodes 23-1a and 23-1b are indicated near transmission position 22-1. In a similar manner, electrodes 23-2a and 23-2b are indicated near transmission position 22-2, electrodes 23-3a and 23-3b are indicated near transmission position 22-3 and electrodes 23-4a and 23-4b are indicated near transmission position 22-4. Although only four pairs of electrodes are shown, it will be apparent to those skilled in the art that both to the left and to the right, seen in FIG. 2, considerably larger numbers of scattering positions and transmission positions and pairs of electrodes associated therewith may be present than the number which is shown in FIG. 2.

FIG. 2 shows an electron beam 24 which hits upon the carrier 5 at transmission position 22-2. Beam 24 exits carrier 5 in the form of a main beam 25-1 with slightly scattered and attenuated beams 252 and 25-3, similarly to beams 17-1, 17-2 and 17-3, respectively, of FIG. 1. Beams 25-2 and 25-3 are deflected by electron lens 7 to form beams 26-2 and 26-3 whilst "main beam" 25-1 is deflected by electron lens 7 to form the main beam 26-1 which is directed precisely at the aperture 9 of aperture element 8.

Main beam 25-1 is in line with the beam 24, which hits upon the transmission position 22-2 of carrier 5 because no voltage had been applied to electrodes 23-2a and 23-2b. All electrodes 23 can have a voltage applied thereto. As a result, an electric field is generated between respective electrodes near a transmission position. The electric field that is generated in this manner deflects the electrons that pass through carrier 5 at the transmission position in question in such a manner that they will not find their way into the aperture 9 of aperture element 8 after being deflected by the electron lens 7. With regard to the electron beam 30 that hits upon carrier 5 at transmission position 22-4 it can be said that if an electric field had not been applied between electrodes 23-4a and 23-4b, the electrons from beam 30 would have followed the dashed line 31 through electron lens 7, aperture 8 and electron lens 10 to the position 32 on master disk 11. By applying a voltage to electrodes 23-4a and 23-4b, however, the electrons from beam 30 are made to follow the path indicated by reference numeral 33 up to electron lens 7 and the path indicated by reference numeral 34 past the electron lens 7. As is indicated in FIG. 2, the electrons that follow path 34 hit upon aperture element 8 rather than finding their way into aperture 9. The situation described herein of electron beams 24 and 30 hitting upon position 29 and not upon position 32 meets the requirement that a pit must be written at position 29 and that no pit must be written at position 32.

In the foregoing, beams 24, 25-1, 30 and 33 have been described by way of example. To those skilled in the art it will be apparent that each transmission position has a few incident beams and a few transmitted beams associated therewith. The incident beams and the transmitted beams together form a row of beams with fixed intervals therebetween, because the transmission positions are arranged at fixed intervals in a row.

FIG. 2 also illustrates in a chain-dotted line and a line of globules a situation as it will occur some time later. Master disk 11 moves in the direction indicated by arrow B at speeds that may exceed 10 m/s. The position of beams 1, 24 and 30, carrier 5, lenses 7 and 10 and aperture element 8 comprising aperture 9 has neither changed in FIG. 2 nor in actual fact, only the master disk 11 moves in the direction indicated by arrow B. The dimensions of the pits that are to be formed by means of the electron beams at position 29 on the master disk 11 are in the order of 50 nm and smaller. It is obvious, therefore, that drawings 1–6 are not to scale. Since writing must take place at position 29 on master disk 11, whilst no such writing must take place at position 32, and because master disk 11 moves in the direction indicated by arrow B, the situation is such after some time that the position intended to be inscribed is located at 29' in FIG. 2, whilst the position which is intended not to be inscribed is located at 32'. Via the optics consisting of electron lenses 7 and 10 and the aperture 9, the positions 29' and 32' correspond to the transmission positions 22-1 and 22-3, respectively. In the present situation, one part of the supply beam 1, which is indicated as electron beam 24', is intended to reach master disk 11, whilst another part, which is indicated as electron beam 30', is intended not to reach master disk 11. It is noted that in actual fact beams 24' and 30' are not the same beams as beams 24 and 30. To that end, a voltage is not applied to electrodes 23-1a and 23-1b, as a result of which the electron beam 24' continues as electron beam 25-1', 26-1', 27-1' and 28-1', after which it finally hits upon master disk 11 at position 29'. Similarly to the above-described situation with regard to electron beam 30, a voltage has been applied to electrodes 23-3a and 23-3b in order to deflect electron beam 33', which is the beam 30' that has been transmitted at transmission position 23-3, and that in such a manner that beam 34, after deflection by electron lens 7, does not reach aperture 9 but another location on aperture element 8. In this way no inscribing will take place at position 32' on master disk 11.

Figure 2A:
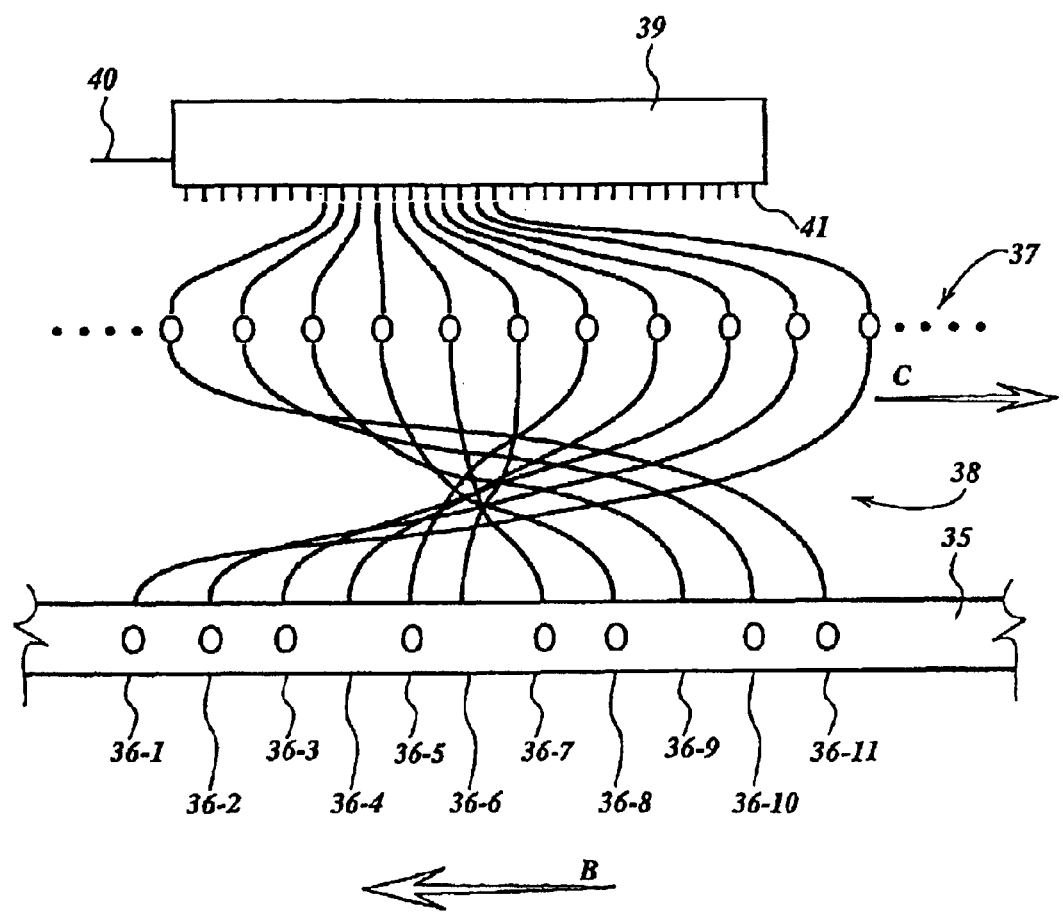
FIG. 2a shows a first embodiment of a device for controlling the control means.

FIG. 2A schematically shows a relation between positions on master disk 11 to be inscribed or not to be inscribed and the excitation or non-excitation of electrodes 23. Reference numeral 35 in FIG. 2A indicates a track on master disk 11. The positions 36-1, 36-2, . . . , 36-11 at which a pit is to be or is not to be formed in groove 35 of master disk 11 are regularly spaced apart in track 35. By way of example, pits are to be formed at positions 36-1, 36-2, 36-3, 36-5, 36-7, 36-8, 36-10 and 36-11. No pits are to be formed at positions 36-4, 36-6 and 36-9. Numeral 37 indicates whether or not the electrodes 23 must be excited in order to generate the pattern of pits 36. "0" means "to be excited" and "1" means "not to be excited". Lines 38 indicate the manner in which the excitation of electrodes 23 corresponds to pits 36 in groove 35 at the illustrated moment in FIG. 2A. As described above with reference to FIG. 2, the groove 35 of master disk 11 comprising the pits 36 moves to the left in the direction of arrow B in FIG. 2A. As appears from the connecting lines 38, this means that the pattern of zeroes and ones as indicated at 37 must move to the right in order to ensure that the pattern of excited and non-excited electrodes 23 is at all times projected onto the correct positions 36 on the master disk 11 moving in the direction of arrow B. Pattern 37 can be generated in a simple manner by means of a delay element 39. Delay element 39 has an input 40 and outputs 41. The number of outputs 41 equals the number of pairs of electrodes 23. Delay element 39 may consist of a number of delay gates which are known per se, but it may also be a shift register which is known per se. The delay gates which are known per se make it possible to achieve a delay accuracy of 0.5 nsec. The operation of delay element 39 is as follows. A signal train consisting of a series of zeros and ones is presented at input 40 of the delay element 39, which subsequently exit at outputs 41 again (from the left to the right in FIG. 2A). The outputs 41 of delay element 39 are connected to the electrodes 23. A signal 0 in the signal train corresponds to "pit" in groove 35, whilst a 1 in the signal train that is present at input 40 of the delay element 39 corresponds to "no pit" in groove 35. The signal to be written into groove 35 in the form of "pits" and "no pits" is well-known. Presenting this signal in binary form at the input 40 of the delay element 39 in the form of zeroes and ones, wherein zeroes correspond to "pits" and ones correspond to "no pits", makes it possible to excite the electrodes 23 in such a manner that the pattern of excitation and non-excitation, respectively, will correctly advance in the direction indicated by arrow C in order to continue to correspond to the pattern of pits/no pits that advances in the direction indicated by arrow B.

Based on the use of known electron-sensitive resists and pits having a diameter in the order of 50 nm and a spacing between the tracks of 200 nm, a writing speed of about 12 m/s is required in order to be able to inscribe a master disk having a diameter of 12 cm within a period of about 1 hour. In that case, assuming that spots having a diameter of 50 nm are used, about sixty transmission positions 22 are needed in order to effect a complete "exposure" of the electron-sensitive resist in sixty steps per pit. This means, among other things, that the delay element 39 has sixty outputs 41 in such a case.

In the laid-open European patent application EP-A-0 660 314 it is indicated that in cases where not all pits have the same length in the direction of the track, shorter pits are written with a higher power than longer pits. In the case of electron beams, the power in the beam depends both on the kinetic energy of the electrons and on the number of electrons. In the present invention it is initially assumed that all electrons have the same kinetic energy, and that differences in power are caused by differences in the number of electrons, that is, differences in the current intensity in the various electron beams. If the current intensity is not identical in all beams, this indicates the use of a write strategy. An arrangement as indicated in FIG. 2B makes it possible to realise different write strategies by means of an apparatus according to the present invention.

Figure 2B:
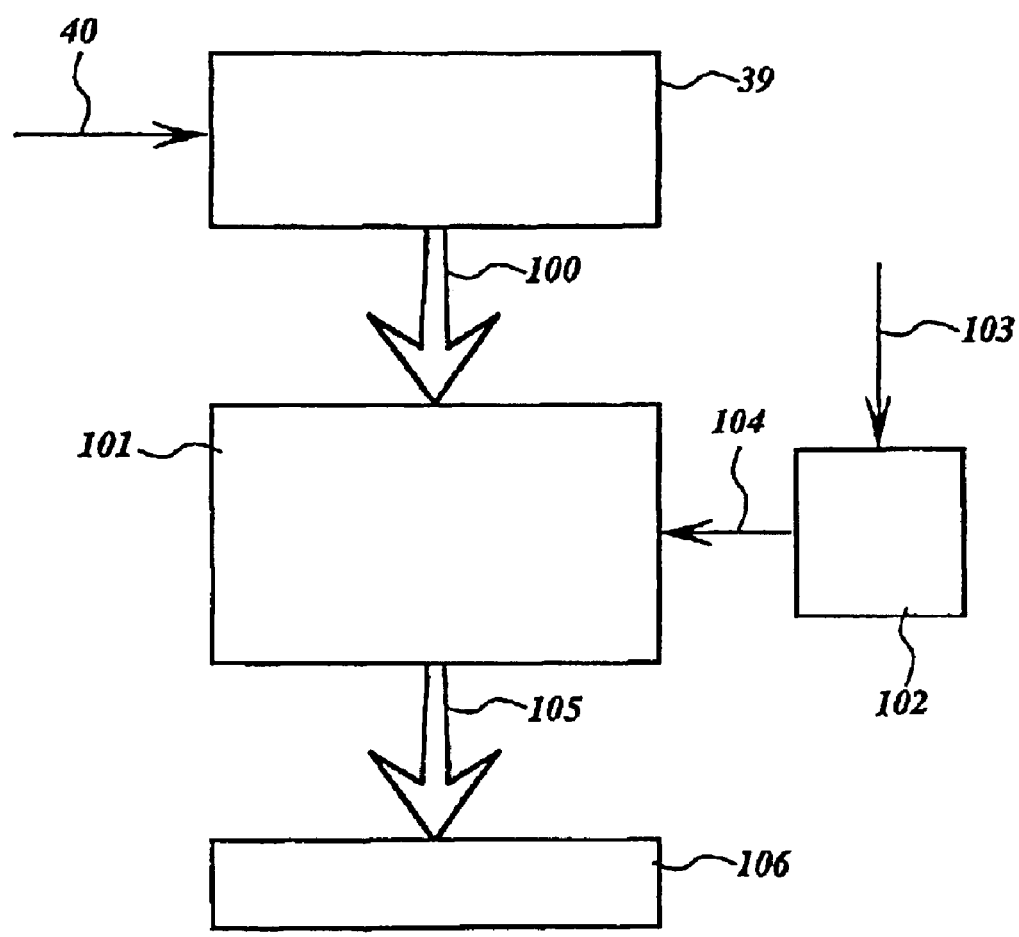
FIG. 2b shows a second embodiment of a device for controlling the control means.

FIG. 2B shows another delay element 39, at the input of which the signal to be written arrives via a line 40. The signal, which arrives via line 40, becomes available on a bus 100, which comprises as many lines as there outputs of the delay element 39, each time with an increased delay. Bus 100 is connected to a write strategy devising circuit 101. Write strategy devising circuit 101 receives a write strategy signal via a line 104 from a write strategy circuit 102. Write strategy circuit 102 is controlled by a write strategy selection signal on a line 103. The output of the write strategy devising circuit is made up of a bus 105. Bus 105 comprises at least as many lines as bus 100. Bus 105 is connected to, respectively, electrodes 23, coils 42, and electrodes 70 and 71. All these elements are jointly represented by reference numeral 106.

The operation of the circuit that is shown in FIG. 2B is as follows. A write strategy selection signal arrives on line 103. Said write strategy selection signal can be generated manually or automatically. The write strategy selection signal that arrives on line 103 causes write strategy circuit 102 to devise, or select, a write strategy. In the latter case it is assumed that various write strategies are stored, permanently or temporarily, in a memory in circuit 102. Circuit 102 may also be built up in such a manner, however, that a specific write strategy is computed, by means of incorporated software, on the basis of data input via line 103. The output signal of the write strategy circuit 102, which is a specific write strategy to be used in writing pits in master disk 11, is fed to the write strategy devising circuit 101 via line 104. Write strategy devising circuit 101 combines the signals that arrive via bus 100 with the control signals that arrive via line 104, and outputs the combined signals as an output signal on bus 105 for controlling the electrodes 106.

The intensity of the various electron beams from the row of beams can be controlled in various ways. FIG. 2 shows by way of example a pair of electrodes 107a, 107b. A very low voltage may be applied across pair of electrodes 107a, 107b, as a result of which the electron beam 31 moves to a small extent over aperture element 8 and aperture 9. Said small movement makes it possible to control the number of electrons that are transmitted through the aperture 9. This provides a possibility of controlling the intensity of the power of the electron beam 31 that is obtained in the case of non-excitation of the pair of electrodes 23-4a, 23-b. A similar control possibility with electric fields is also possible with an embodiment of the invention according to FIG. 3. Conversely, both with an embodiment according to FIG. 3 and with an embodiment according to FIG. 2, a magnetic field can provide the possibility of controlling the intensity of the power of the electron beam that passes through the aperture 9. It is also possible to have electrodes 23 in FIG. 2 and coils 42 in FIG. 3 carry out the two functions that are carried out by electrodes 23 and 107 in FIG. 2. In all cases the electrodes, coils, etc. that are to be controlled are indicated by reference numeral 106 in FIG. 2B. It is also possible to control electrodes 23 or coils 42 by means of a signal that is sufficiently small to realise the above-described control function. In that case the controllable means comprise said controllable control means.

Figure 3:
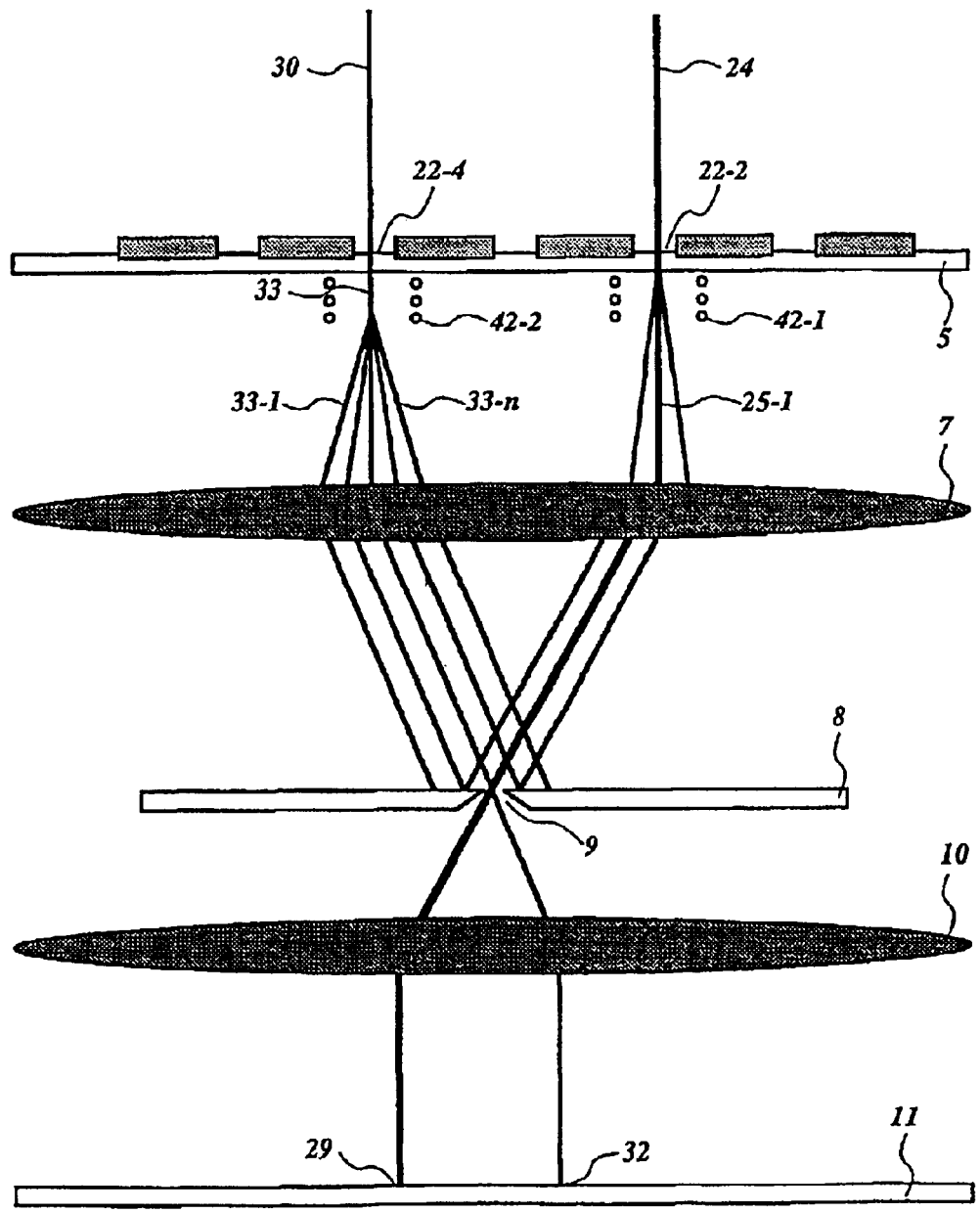
FIG. 3 shows a second embodiment of a device according to the invention.

FIG. 3 shows an alternative embodiment of electrodes 23. For the sake of clarity, the elements in question are only shown at two transmission positions. As is the case in FIG. 2, two electron beams 24 and 30 are used in FIG. 3, wherein electron beam 24 contains electrons which are intended to reach the master disk at a position 29, whilst electron beam 30 contains electrons which are intended not to reach the position 32 on master disk 32. A coil 42 is provided near each transmission position, indicated coil 42-1 and coil 42-2 in FIG. 3. If a coil 42 is not excited, as is for example the case with coil 42-1, the electron beam 25-1 passing through carrier 5 at transmission position 22-2 will not be influenced. When coil 42-2 is excited, however, a component of the magnetic field thus generated, which is not axial with the respective beam from the row of beams, strongly scatters beam 33 to form beams 33-1, . . . , 33-n, which are directed in such a manner that practically no electron from the original beam can reach the aperture 9 after having passed through electron lens 7.

Electrodes 23 or coils 42 can be controlled by connecting means that form a connection between said electrodes or said coils and the outputs 41 of delay element 39. Since the carrier 5 comprising elements 6 and 21 represents a linear pattern, sufficient space is available in transverse direction, that is, a direction out of the plane of drawing of FIGS. 1, 2, and 3, for making the connections between electrodes 23 or coils 42 and the outputs 41 of delay element 39.

Figure 4:
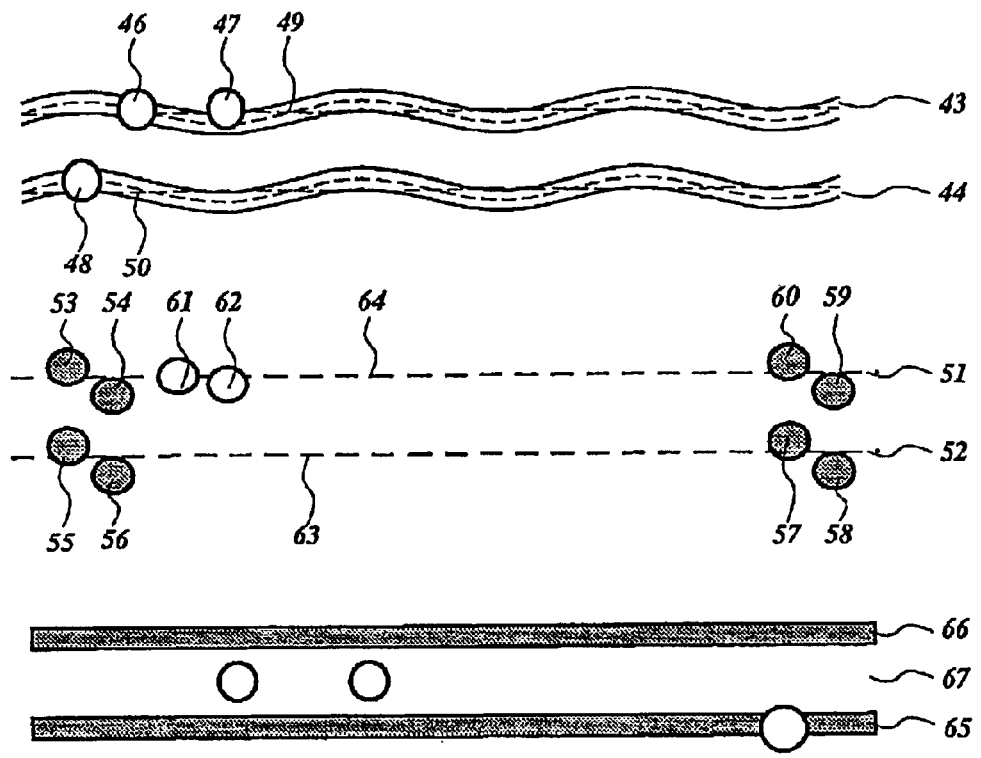
FIG. 4 shows various practical formats of current optical media.

FIG. 4 shows various well-known patterns of grooves and pits on optical disks. The same grooves and pits are to be inscribed in the master disk 11 by means of the present device. Reference numerals 43 and 44 indicate two undulating (usually called "wobble") grooves lying side by side, as used on writable and rewritable compact discs, for example. Reference numerals 46, 47 and 48 indicate pits which are centred per se on non-undulating lines 49 and 50. Reference numerals 51 and 52 furthermore indicate two tracks lying side by side, as they occur, for example, on a so-called magneto-optical disk. The pits 53, 54, . . . , 59, 60, which are illustrated in grey, have been formed by the disk manufacturer, whilst the pits 61 and 62, which are illustrated in white, are located in the paths 63 and 64 in which a user can write his own data. Furthermore, two grooves 65 and 66 are shown, which grooves are separated by a non-groove portion 67. Pits can be formed both in grooves 65, 66 and between said grooves, in portion 67.

Figure 5:
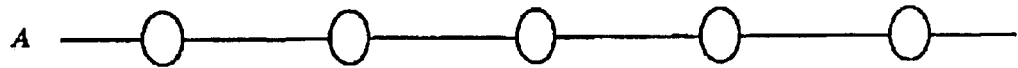
FIG. 5 shows an example of a single-track and a double-track written signal.
Figure 5:
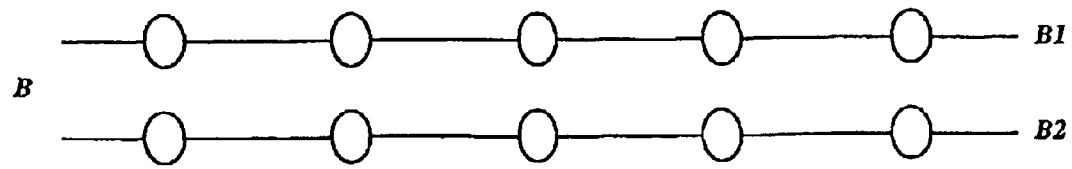

FIG. 5 schematically indicates a series of pits on a single track on line A and a series of pits on a double track on line B, also called "two-spot" system. The pits in the two tracks of line B are related to each other. Although they are represented as exactly the same pits in FIG. 5, this is not necessarily the case; for example, track B1 may contain user information, whilst track B2, which is related to track B1, may contain sector information and/or track number information, for example.

Figure 6:
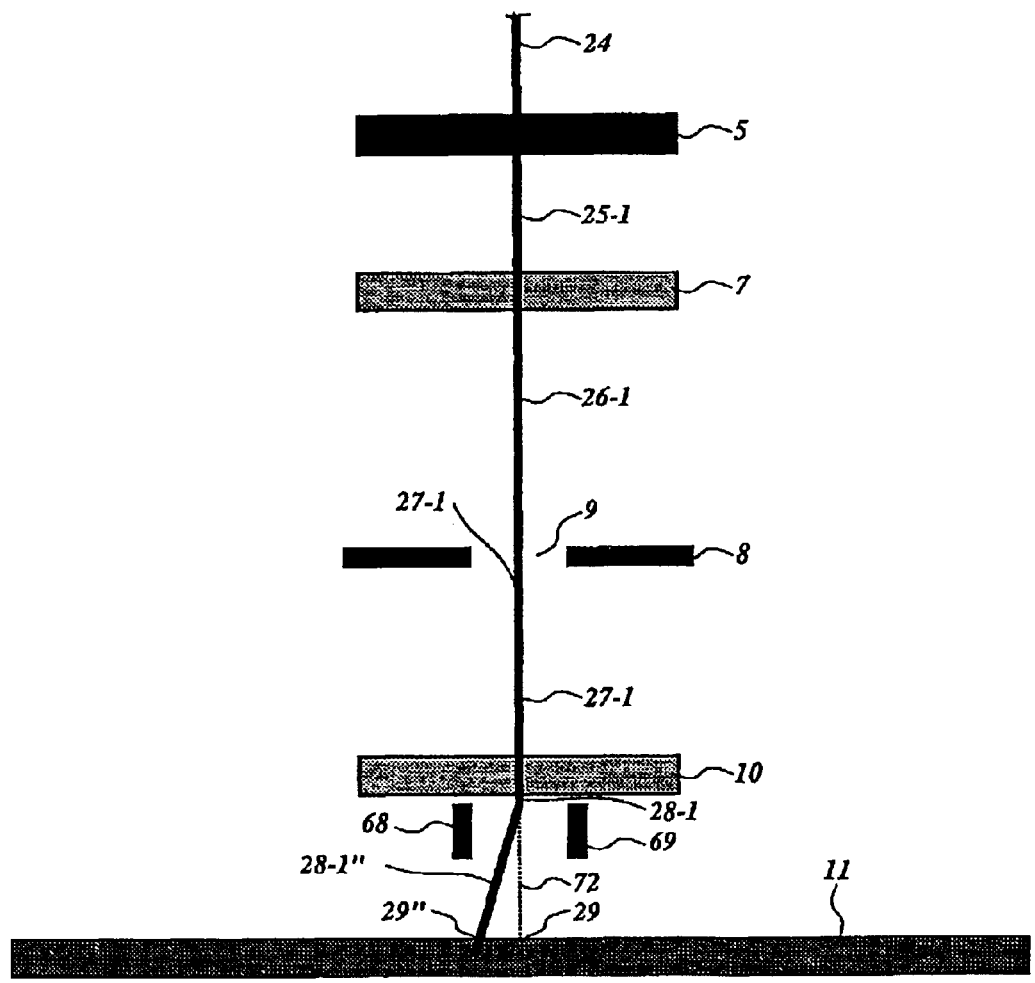
FIG. 6 shows a third embodiment of a device according to the invention.
Figure 7:
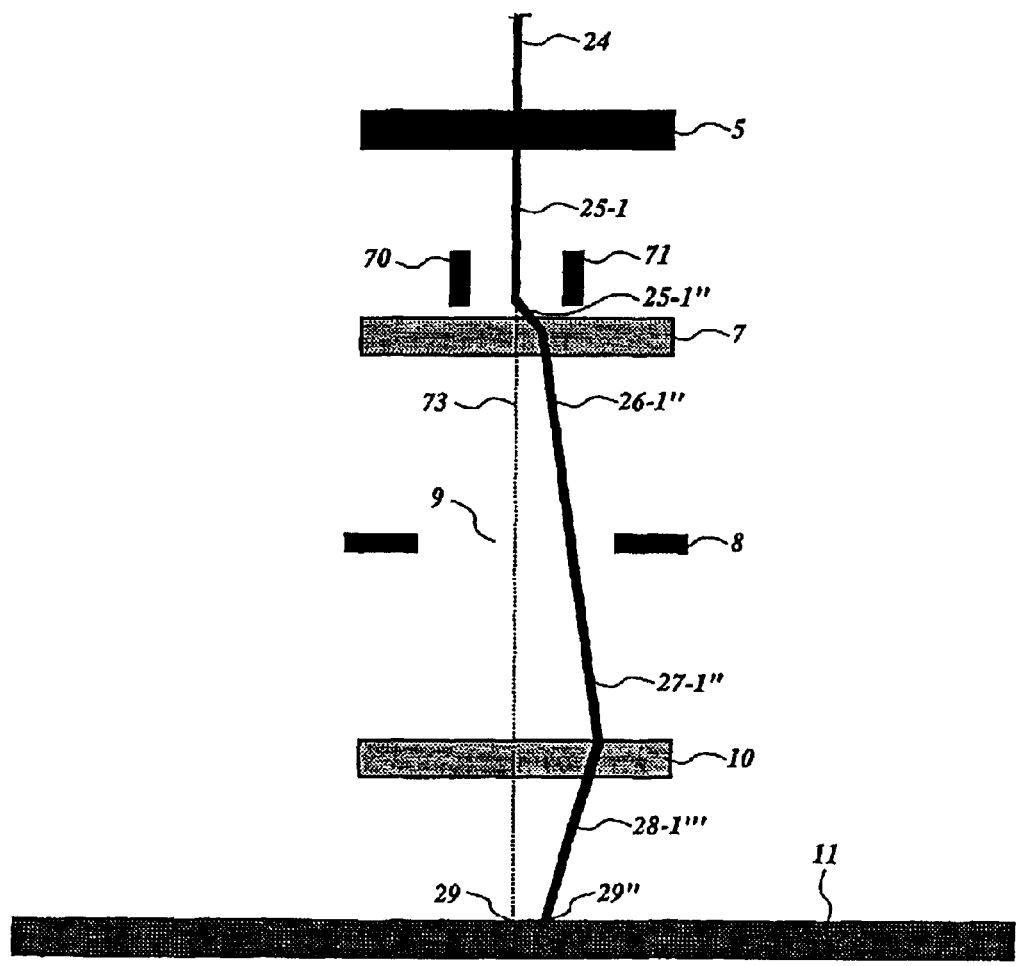
FIG. 7 shows a fourth embodiment of a device according to the invention.
Figure 8:
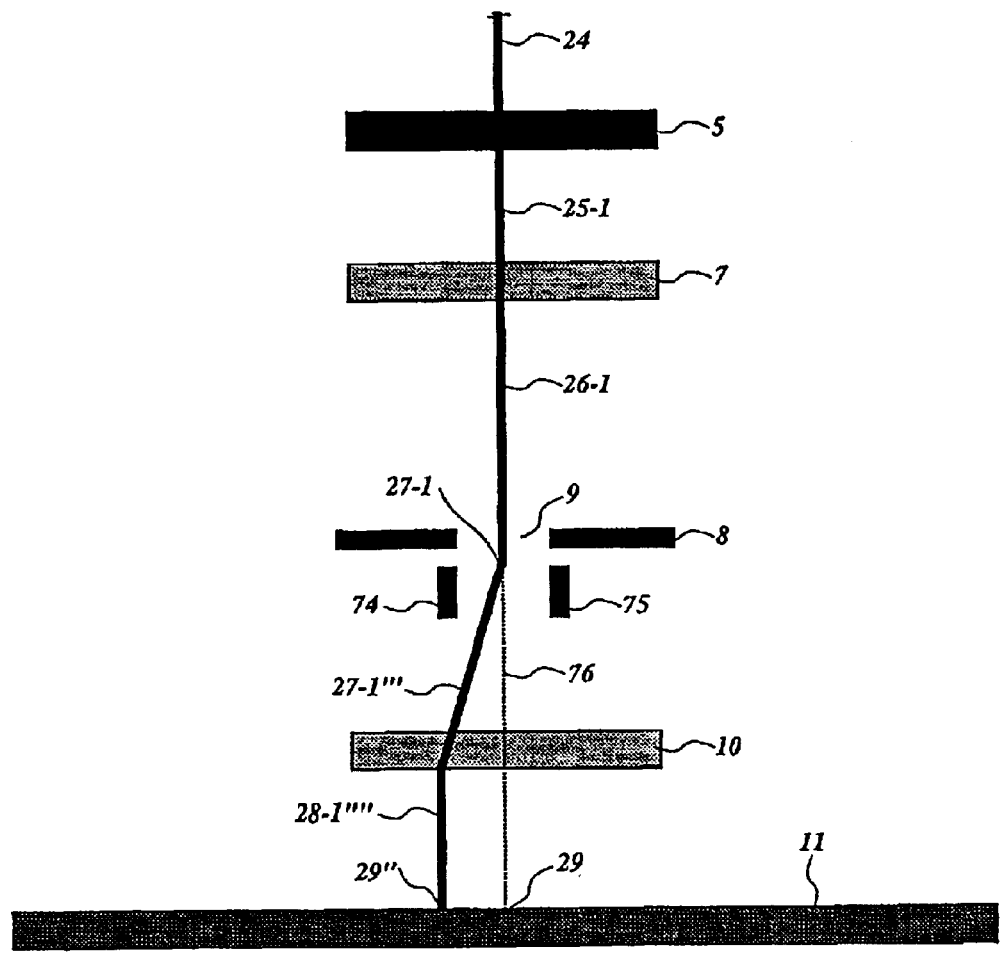
FIG. 8 shows a fifth embodiment of a device according to the invention.

In order to be able to form the undulating grooves 43 and 44, the pits 53 and 54, which are shifted laterally with respect to a central line, the pits in grooves 65 and 66 and in the area 67 between said grooves in one operation, it must be possible to move the electron beam 28-1 (see FIG. 2) also in a direction perpendicularly to the plane of drawing of FIG. 2. FIGS. 6, 7 and 8 show three possible solutions for this problem.

In FIG. 6, two electrodes 68 and 69 are disposed between electron lens 10 and master disk 11 on either side of beam 28-1. If no electric voltage is applied to electrodes 68 and 69, the electron beam 28-1 will move straight ahead, as is indicated in dashed line 72, in order to reach position 29 on master disk 11, all this as described with reference to FIG. 2. If an electric voltage is applied between electrodes 68 and 69, however, the electron beam 28-1 will be deflected in lateral direction, as is indicated by numeral 28-1", as a result of which the beam in question will reach position 29" on master disk 11. Position 29" is shifted in lateral direction with respect to position 29. A pair of electrodes 68, 69 is provided for each electron beam that forms part of electron beam 1 (see FIG. 2), as is illustrated by way of example in a dashed line and numeral 68 in FIG. 2.

FIG. 7 shows another embodiment, by means of which it is also possible to effect that position 29" is "exposed" instead of position 29 on master disk 11. An pair of electrodes 70, 71 is disposed near each transmission position 22 in carrier 5. Electrodes 70, 71 may be disposed at the same level with respect to carrier 5 as electrodes 23, but preferably this is not the case in order to prevent mutual influencing. In the case that a voltage is not applied to electrodes 70 and 71, the electron beam 24 will move straight ahead, seen in FIG. 7, along dashed line 73 and finally reach position 29 on master disk 11, all this as described with reference to FIG. 2. If a voltage is applied between the electrodes 70 and 71, however, the beam 25-1 that passes through carrier 5 will be deflected to form beam 25-1". Electron lens 7 deflects beam 25-1" to form beam 26-1". In this respect it should be considered that in the view according to FIG. 2 beams 25-1" and 26-1" travel the same path as beams 25-1 and 26-1 that are shown in FIG. 2. In this case it is necessary for the aperture 9 to be widened in transverse direction, as is indicated in the sectional view of FIG. 7. In FIG. 7 it is assumed by way of example that, in an electron-optical sense, the distance from pair of electrodes 70, 71 to electron lens 7 equals the distance between electron lens 7 and aperture element 8 and the electron-optical focal distance of electron lens 7. In that case aperture 9 must be in the form of an elongate slot as shown in FIG. 7. Beam 25-1" is deflected by electron lens 7 to form beam 26-1", which passes through elongate aperture 9 in aperture element 8 and exits therefrom as electron beam 27-1". Electron beam 27-1" is deflected by electron lens 10 to form electron beam 28-1''', which subsequently reaches position 29" on master disk 11.

FIG. 8 shows another embodiment. In said embodiment, two electrodes 74 and 75 are disposed near aperture 9.

In the situation that is shown in FIG. 8, beams 24, 25-1 and 26-1 are identical to beams 24, 25-1 and 26-1 of FIG. 2 up to and including the passage of aperture 9. If a voltage is not applied between electrodes 74 and 75, beam 26-1 will continue as beam 76 and finally reach position 29 on master disk 11, all this as shown and described in connection with FIG. 2. If a voltage is applied between electrodes 74 and 75, beam 27-1 will be deflected to form beam 27-1'''. After passing electron lens 10, beam 27-1''' is deflected to form beam 28-1''''. Beam 28-1'''' then reaches master disk 11 at position 29''.

Figure 9:
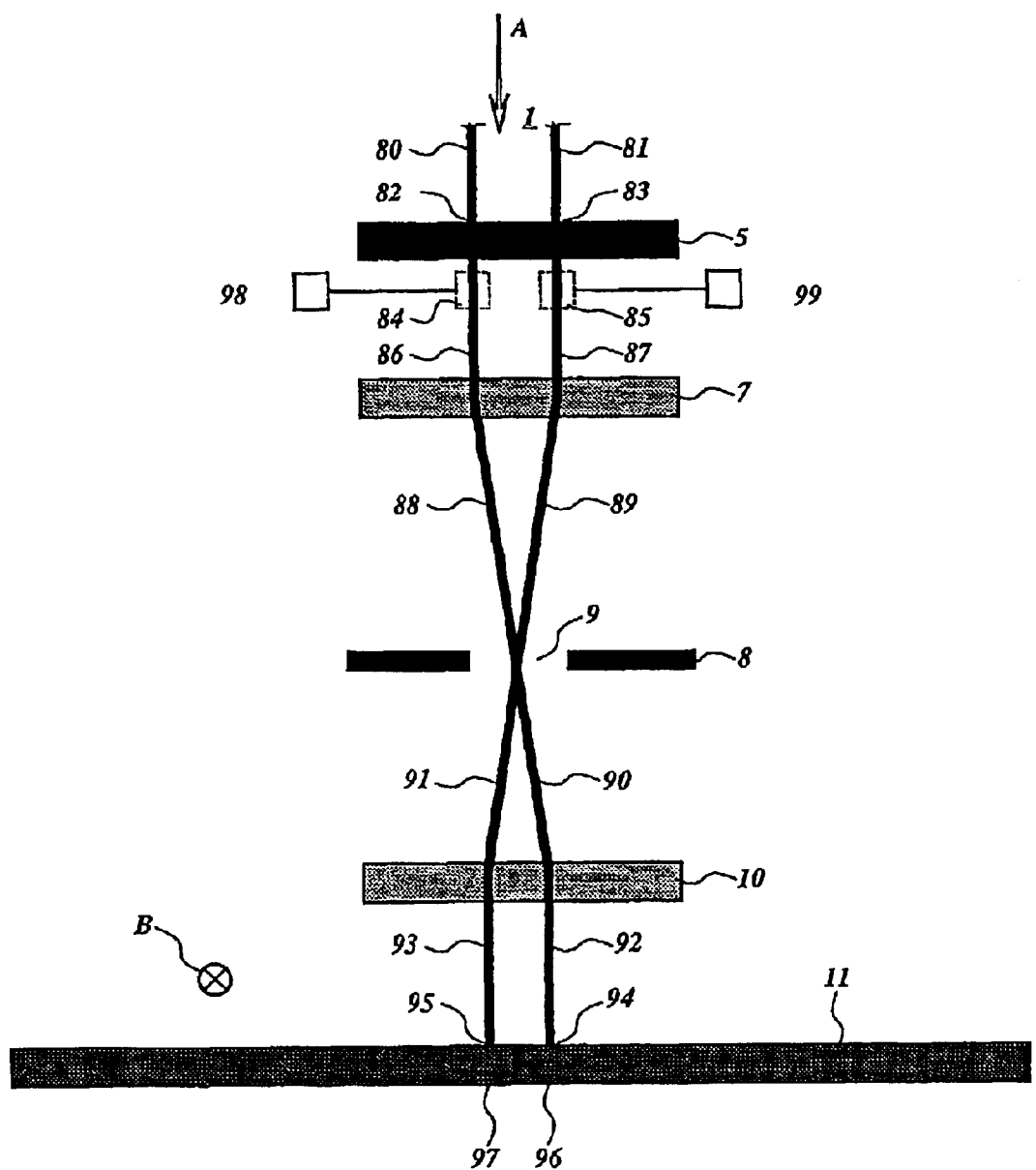
FIG. 9 shows a sixth embodiment of a device according to the invention.

FIG. 9 shows another embodiment for writing two tracks one beside another. In the present embodiment, carrier 5 comprises two rows of transmission positions lying side by side. Note that FIG. 9 is a view transversely to the views that are shown in FIGS. 1 and 2; refer also to the representation (rear view) of arrow B in FIG. 9. Two transmission positions 82 and 83 lying side by side are shown to be present in carrier 5 in FIG. 9. Each of said transmission positions 82 and 83 of FIG. 9 corresponds to a transmission position 22 of FIG. 2. Also in this case a pair of electrodes, schematically indicated by numerals 84 and 85, are disposed near each of the transmission positions 82 and 83. An electron beam 1 hits upon carrier 5 in the direction indicated by arrow A. Electron beams 80 and 81 from beam 1 are transmitted by carrier 5 at transmission positions 82 and 83. Depending on whether positions 94 and 95 of master disk 11 are to be inscribed or not, pairs of electrodes 84 and 85 are controlled or not controlled, as the case may be, by control electronics 98 or 99, respectively, not to scatter or to scatter, respectively, the electron beams 86 and 87 transmitted at transmission positions 82 and 83. Beams 86 and 87 are deflected by electron optics 7 to form beams 88 and 89. Both beams 88 and 89 are directed at the aperture 9 in aperture element 8. After passing aperture 9, said electron beams 88 and 89 continue to electron optics 10 as beams 90 and 91. Electron optics 10 in turn deflects beams 90 and 91 to form beams 92 and 93. Beam 92 hits upon the master disk 11 at position 94, and electron beam 93 hits upon the master disk 11 at position 95. Positions 94 and 95 are located on two tracks positioned right beside each other, which tracks are schematically indicated by numerals 96 and 97.

In the foregoing, the present invention has been discussed by means of an exemplary embodiment wherein a carrier 5 comprises one or more rows of transmission positions and scattering positions. The present invention is not limited to this exemplary embodiment, however. The present invention can also be implemented by providing cold cathode emitter elements as described in U.S. Pat. No. 5,216,219 at the positions indicated at 22, 82 and 83 in the above descriptions. As in FIGS. 2, 3, 7 and 9, elements 23, 42, 70, 71, 84 and 95 are provided at the exit openings of said cold cathode emitter elements for scattering or not scattering the electron beams that exit from the cold cathode emitter elements.

The foregoing has started from prior art, U.S. Pat. No. 5,216,219, wherein the master disk is rotated. The present invention is not limited to rotating master disks, however. Also translating master disks can be inscribed by electron-beam lithography in the illustrated manner. In that case arrow B in FIG. 2 indicates the direction of the translation of master disk 11.

The foregoing has proceeded from the use of an electron transmitting carrier, on which electron absorbing and/or electron scattering elements are present. Carrier 5 may also be an electron absorbing and/or scattering element including openings through which the electrons can move freely.

In the foregoing pairs of electrodes are used in all cases. It is noted that the above-described effects of the pairs of electrodes on the electrons in the electron beams can also be obtained, depending on the effect that is desired, by means of a single electrode or by means of more than two electrodes.

In each of the above-described cases the drivable means, viz. electrodes 23 in FIG. 2 and coils 42 in FIG. 3, are disposed before the lens 7, seen in the direction of movement of the electrons in the row of beams. It is noted that said means may also be disposed after the lens 7, but before aperture element 8.

What is claimed is:

1. A device for electron-beam lithography for manufacturing a master disk, the device comprising:
    means for moving the master disk,
    means for generating a row of electron beams, and
    means for directing electrons from said row of beams onto a track on the master disk,
wherein the row of beams extends substantially parallel to the track,
    an aperture element comprising at least one aperture,
    first lens means disposed between the means for generating said row of beams and the aperture element for the purpose of deflecting electrons in said row of beams in the direction of said at least one aperture,
    second lens means disposed between the aperture element and the master disk for deflecting electrons that have passed through said at least one aperture in an intended direction onto the master disk, and
    controllable means for independently deflecting electrons in said row of beams to a position substantially beside the aperture are disposed between the means for generating said row of beams and said aperture element.

2. A device according to claim 1, wherein control means are present for operating the controllable means in succession, each time from a first beam from said row of beams until a last beam from said row of beams, by means of a signal train, which is based on one and the same, respectively time-shifted signal train for each beam from said row of beams.

3. A device according to claim 1, wherein said controllable means and/or said controllable control means cause at least an electric deflection.

4. A device according to claim 1, wherein said controllable means and/or said controllable control means cause a magnetic deflection.

5. A device according to claim 1, wherein said controllable means are disposed between the means for generating said row of beams and said first lens means.

6. A device for electron-beam lithography according to claim 1, wherein a substantially linear grid pattern comprising scattering positions and transmission positions is formed in the supply beam, substantially parallel to the track, for absorbing and/or scattering electrons in the supply beam more strongly at the scattering positions and less strongly at the transmission positions.

7. A device for electron-beam lithography according to claim 1, wherein at least one row of cold cathode emitter elements is arranged substantially parallel to the track for the purpose of generating said row of electron beams.

8. A device according to claim 1, wherein controllable control means are present for controlling the amount of electrons in the beam in question that passes the aperture in the case that the controllable means do not deflect the electrons in a specific beam.

9. A device according to claim 8, wherein said control means forms part of said controllable means.

10. A device according to claim 8, wherein a control circuit is provided for controlling said controllable control means.

11. A device according to claim 1, wherein controllable deflection means are provided for deflecting one or more beams from said row of beams in a direction substantially perpendicularly to a direction of movement of the track.

12. A device according to claim 11, wherein said controllable deflection means are disposed between the means for generating said row of beams and said first lens means.

13. A device according to claim 11, wherein said controllable deflection means are disposed between said second lens means and said master disk.

14. A device according to claim 11, wherein said controllable deflection means are disposed near said aperture.

15. A device according to claim 11, wherein said controllable deflection means cause an electrostatic deflection.

16. A device according to claim 11, wherein said controllable deflection means cause a magnetic deflection.

17. A device for electron-beam lithography according to claim 16, wherein said controllable means and/or said controllable control means are disposed near one or more transmission positions.

18. A method for the electron-beam lithography manufacture of a master disk, the method comprising:
    generating and independently directing a row of electron beams at a track on the master disk,
    wherein said row of beams is applied in a direction substantially parallel to the track on the master disk, in that said row of beams is deflected through an aperture in an aperture element by a first lens element and projected onto the master disk by a second lens element, and said beams are controlled either to be directed at the aperture or not to be directed at the aperture.

19. A method according to claim 18, wherein at least one beam from said row of beams is deflected in a direction transversely to the direction of the track.

20. A method according to claim 18, wherein seen in the direction of movement of the track relative to the row of beams, all controlled beams are controlled in succession, from a first beam from the row of beams to a last beam from said row of beams, by a signal train, which is based on one and the same, respectively time-shifted, signal train for each beam from said row of beams.

21. A method according to claim 20, wherein said shift in time equals the length of time that a track point requires for moving from a first position with respect to a first beam from said row of beams to a second position, wherein a location of said second position relative to the beam next to said first beam from said row of beams is similar to a location of said first position relative to said first beam.

22. A device for electron-beam lithography for manufacturing a master disk, the device comprising:
    a motor configured to move the master disk,
    a electron beam generator configured to generate a row of electron beams, and
    an electron director configured to direct electrons from said row of beams onto a track on the master disk, wherein the row of beams extends substantially parallel to the track, an aperture element comprising at least one aperture, a first deflector disposed between the electron beam generator and the aperture element for the purpose of deflecting electrons in said row of beams in the direction of said at least one aperture, a second deflector disposed between the aperture element and the master disk for deflecting electrons that have passed through said at least one aperture in an intended direction onto the master disk, and a controller for independently deflecting electrons in said row of beams to a position substantially beside the aperture are disposed between the electron beam generator and said aperture element.

* * * * *